United States Patent [19]
Zhao et al.

[11] Patent Number: 5,770,520
[45] Date of Patent: Jun. 23, 1998

[54] METHOD OF MAKING A BARRIER LAYER FOR VIA OR CONTACT OPENING OF INTEGRATED CIRCUIT STRUCTURE

[75] Inventors: Joe W. Zhao, San Jose; Zhihai Wang, Sunnyvale; Wilbur G. Catabay, Santa Clara, all of Calif.

[73] Assignee: LSI Logic Corporation, Milpitas, Calif.

[21] Appl. No.: 760,466

[22] Filed: Dec. 5, 1996

[51] Int. Cl.$^6$ .................................................... H01L 21/44
[52] U.S. Cl. .................................... 438/653; 438/685
[58] Field of Search ................................... 437/190, 192; 438/636, 653, 683, 685

[56] References Cited

U.S. PATENT DOCUMENTS

| | | | |
|---|---|---|---|
| 5,066,615 | 11/1991 | Brady et al. | 437/229 |
| 5,384,289 | 1/1995 | Westmoreland | 437/245 |
| 5,559,047 | 9/1996 | Urabe | 437/41 |
| 5,576,244 | 11/1996 | Hayashi et al. | 437/200 |
| 5,639,678 | 6/1997 | Lee et al. | 437/41 |
| 5,668,411 | 9/1997 | Hong et al. | 257/751 |

*Primary Examiner*—Charles L. Bowers, Jr.
*Assistant Examiner*—Reneé R. Berry
*Attorney, Agent, or Firm*—John P. Taylor

[57] ABSTRACT

Described is a barrier layer in an integrated circuit structure which is formed in a via or contact opening over an underlying material in which diffusion of the underlying material (or filler material deposited over the barrier layer) through the barrier layer is inhibited without unduly increasing the thickness and resistivity of the barrier layer. This is accomplished by substituting an amorphous material for the crystalline titanium nitride to thereby eliminate the present of grain boundaries which are believed to provide the diffusion path through the titanium nitride material. In a preferred embodiment, the amorphous barrier layer comprises an amorphous ternary Ti—Si—N material formed using a source of titanium, a source of silicon, and a source of nitrogen. None of the source materials should contain oxygen to avoid formation of undesirable oxides which would increase the resistivity of the barrier layer. In a particularly preferred embodiment, an organic source of titanium is used, and either or both of the silicon and nitrogen sources are capable of reacting with the organic portion of the organic titanium reactant to form gaseous byproducts which can then be removed from the deposition chamber to inhibit the formation of carbon deposits in the chamber or on the integrated circuit structure.

21 Claims, 2 Drawing Sheets

5,770,520

METHOD OF MAKING A BARRIER LAYER FOR VIA OR CONTACT OPENING OF INTEGRATED CIRCUIT STRUCTURE

BACKGROUND OF THE INVENTION

1. Field of the Invention

This invention relates to materials used in vias or contact openings in integrated circuit structures. More particularly, this invention relates to improved barrier materials used in vias or contact openings to prevent diffusion between the underlying material and the material used to fill the vias or contact openings.

2. Description of the Related Art

In the filling of vias between metal layers, or the filling of contact openings which connect portions of an underlying active device with metal interconnects such as a wiring level, titanium nitride has been used in the past to provide a barrier layer between the underlying material and the material used to fill the via or contact opening to prevent or inhibit diffusion between the underlying material and the filler material. Such a titanium nitride barrier layer might, for example, be about 200 Angstroms in wall thickness (for a 2000 Angstrom diameter via or contact opening), or as much as 400 Angstroms thick (for a 5000 Angstrom diameter opening).

However, particularly when aluminum or aluminum-copper alloys are used as via/contact opening filler materials (and/or as the underlying material in the case of vias), there is a tendency for the aluminum and/or copper to diffuse through the titanium nitride along the grain boundaries if the titanium nitride layer is not thick enough.

The thickness of the titanium nitride barrier layer is usually controlled because the titanium nitride, while electrically conductive, has a higher electrical resistance than the metal via/contact opening filler material. Also if the deposited titanium nitride is too thick, there is an overhang problem wherein too much of the titanium nitride deposits not only in the via/contact opening, but also on the exposed surface of the insulation layer adjacent the via or contact opening. The deposition of too thick of a titanium nitride barrier can also result in void formation in the via or contact opening. This is shown in prior art FIG. 1, wherein an integrated circuit structure 2 is shown with an insulation layer 10 formed thereon with a via 12 etched through insulation layer 10 to underlying integrated circuit structure 2. A barrier layer 20 of titanium nitride is shown formed on the surfaces of via 12, as well as on the exposed surface of integrated circuit structure 2 at the bottom of via 12. As shown in FIG. 1, however, the titanium nitride simultaneously deposits on opposite sides of the via/contact opening sidewall adjacent the top of the via/contact opening, causing a necking-in, as shown at 22 in prior art FIG. 1, which could eventually result in a closing of the via/contact opening at the top, leaving an unfilled void therein.

Thus, while the obvious answer to the problem of undesired diffusion of metals through the titanium nitride barrier layer might appear to be to increase the thickness of the deposited barrier layer of titanium nitride, such an increase in the titanium nitride thickness is also fraught with problems.

It would, therefore, be desirable to provide a barrier layer for a via or contact opening which will prevent the diffllusion of metal therethrough without the need to unduly increase the barrier layer thickness so that the electrical resistance of the barrier layer is not increased to unacceptable levels, and the other above discussed problems associated with increases in the thickness of the titanium nitride barrier layer may also be avoided.

SUMMARY OF THE INVENTION

In accordance with the invention, in an integrated circuit structure, a barrier layer is formed in a via or contact opening over an underlying material in which diffusion of the underlying material (or filler material deposited over the barrier layer) through the barrier layer is inhibited without unduly increasing the thickness of the barrier layer. This is accomplished by substituting an amorphous material for the crystalline titanium nitride to thereby eliminate the present of grain boundaries which are believed to provide the diffusion path through the titanium nitride material. In a preferred embodiment, the amorphous barrier layer comprises an amorphous ternary Ti—Si—N material formed using a source of titanium, a source of silicon, and a source of nitrogen. None of the source materials should contain oxygen to avoid formation of undesirable oxides which would increase the resistivity of the barrier layer. In a particularly preferred embodiment, an organic source of titanium is used and either or both of the silicon and nitrogen sources are further capable of reacting with the organic portion of the organic titanium reactant to form gaseous byproducts which can then be removed from the deposition chamber to inhibit the formation of carbon deposits in the chamber or on the integrated circuit structure.

DETAILED DESCRIPTION OF THE INVENTION

Figure 1:
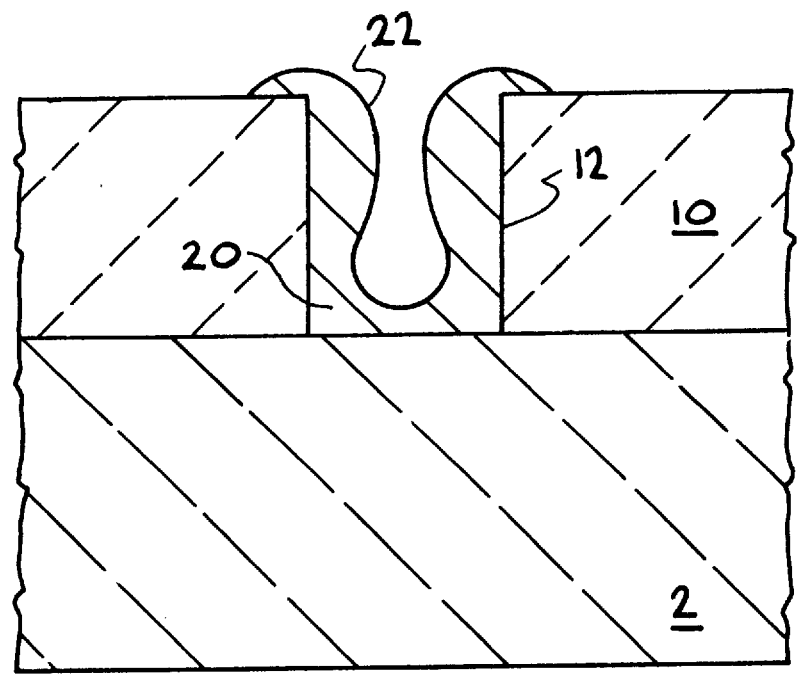
FIG. 1 is a fragmentary side-section view of a prior art structure having formed, in a via of an integrated circuit structure, a titanium nitride barrier layer of a thickness sufficient to avoid diffusion, but forming a void as a result of such a thickness increase, as well as causing an unacceptable increase in the resistance of the contact between the underlying material and a metal interconnect to be subsequently formed over the filled via.
Figure 2:
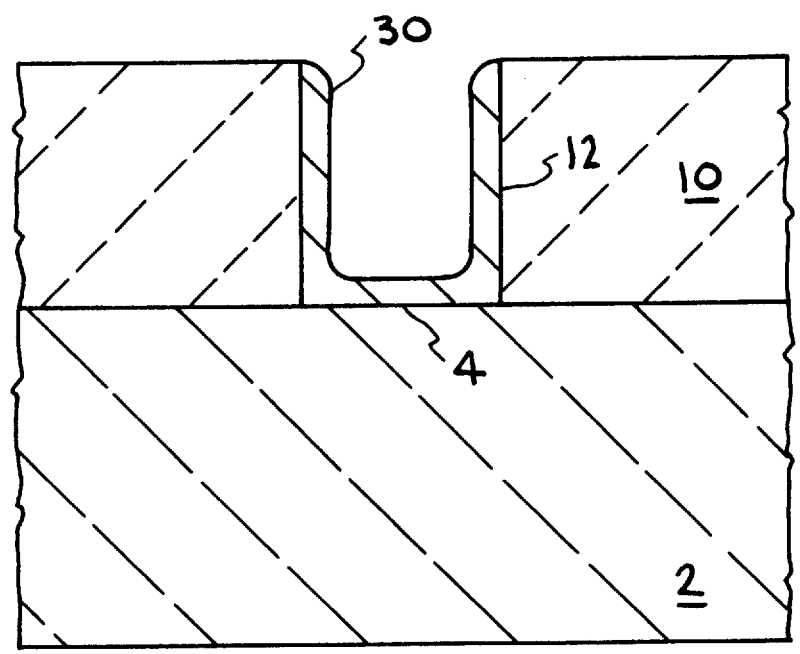
FIG. 2 is a fragmentary side-section view of the structure of the invention having formed, in a via of an integrated circuit structure, a titanium silicon nitride barrier layer of a thickness sufficient to avoid diffusion without the formation of voids by the barrier material.
Figure 3:
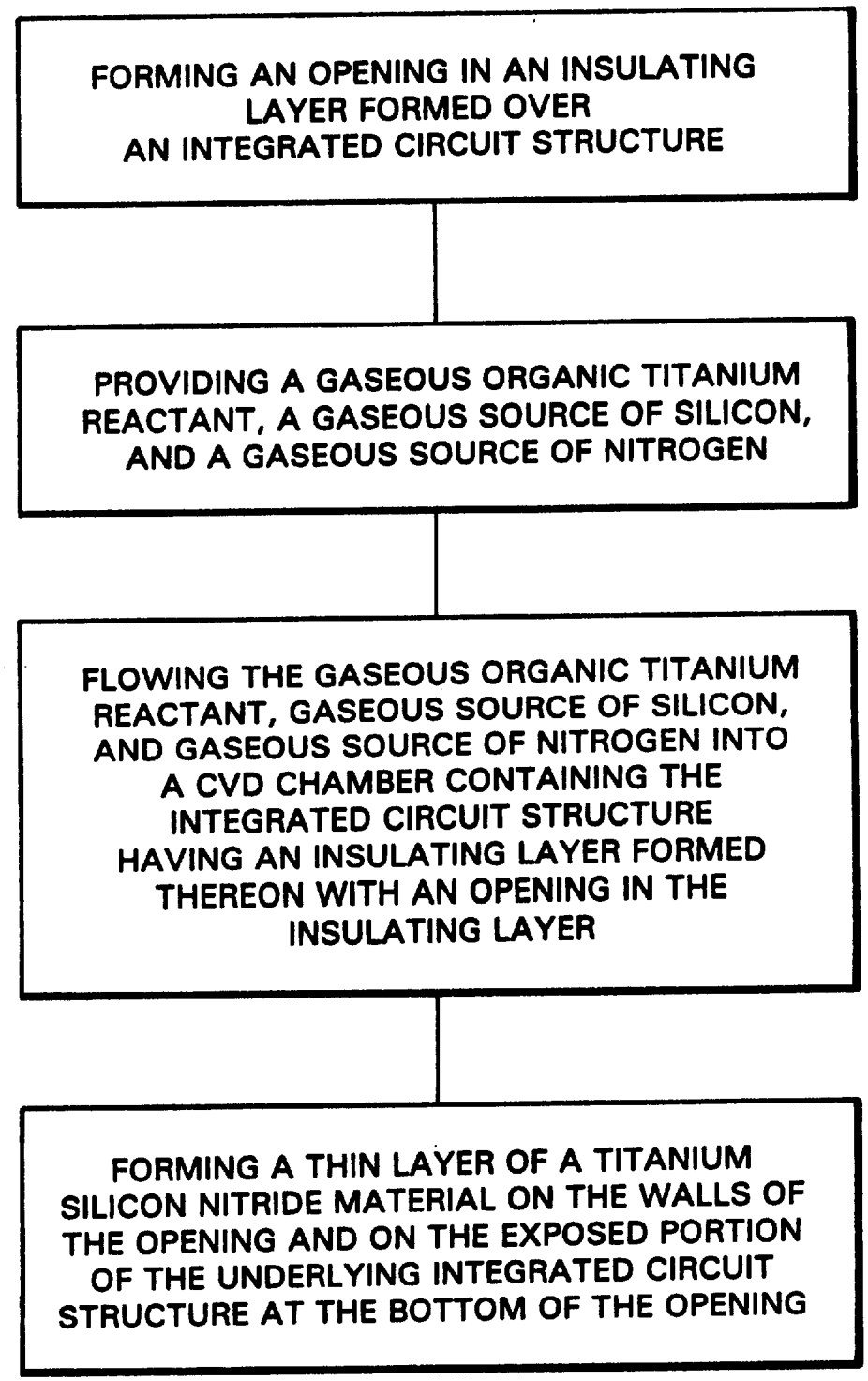
FIG. 3 is a flowsheet illustrating the process of the invention.

Referring now to FIG. 2, an integrated circuit structure is generally illustrated at 2 which may or may not have already formed a first metal wiring layer thereon. Over integrated circuit structure 2 is formed an insulation layer 10 having formed therein an opening 12 extending from the upper surface of insulation layer 10 through insulation layer 10 down to underlying integrated circuit structure 2. When opening 12 extends down to a contact on an active device in integrated circuit structure 2, e.g., to a gate contact of an MOS device, opening 12 is usually referred to as a contact opening. When opening 12 extends through insulation layer 10 to an underlying metal interconnect, i.e., a previously formed wiring level, opening 12 may be referred to as a via. Since this invention may be used in the filling of either vias or contact openings, these terms may be used interchangeably herein, and the use of either term should be deemed to include reference to either type of opening, unless otherwise specified.

In accordance with the invention, a thin layer of a titanium silicon nitride barrier layer 30 is then formed over the surface of opening 12 as well as the exposed surface 4 of underlying integrated circuit structure 2 to prevent interaction between the underlying integrated circuit structure and the filler material which will be deposited over the barrier layer to fill opening 12, while still maintaining a satisfactory resistivity level for the barrier layer.

By use of the term "thin" with respect to the thickness of the barrier layer is a barrier layer having a thickness not exceeding about 150 Angstroms. By use of the term "satisfactory resistivity level" is meant a resistivity level not exceeding 1000 Ω/square.

The titanium silicon nitride barrier layer of the invention is formed by a CVD deposition in a CVD chamber using gaseous sources of titanium, silicon, and nitrogen which are respectively flowed into a CVD chamber is which a semiconductor substrate, having integrated circuit structure 2 formed thereon with insulation layer 10 and opening 12 therein, formed over integrated circuit structure 2.

a. The Reactants

The gaseous source of titanium may comprise an inorganic source of titanium such as, for example, titanium tetrachloride ($TiCl_4$). Preferably, however, to provide a chlorine-free barrier layer, an organic source of titanium is used such as, for example, TDEAT (tetrakis(diethylamido) titanium) having the formula $Ti[N(CH_3CH_2)_2]_4$, or TDMAT (tetrakis(dimethylamido) titanium) having the formula $Ti[N(CH_3)_2]_4$. The use of a gaseous organic source of titanium is preferred, instead of a gaseous inorganic source of titanium, to permit lower temperature formation of the barrier layer which will provide a chlorine-free barrier layer and good step coverage while preserving a low thermal budget.

The gaseous nitrogen source may comprise any gaseous nitrogen source capable of proving a source of nitrogen, and also capable of reacting with organic residues from decomposition of the gaseous titanium source, when the gaseous titanium source is an organic material. While the nitrogen source could be organic, preferably an inorganic source of nitrogen such as ammonia is used as the gaseous source of nitrogen because of the liberation of hydrogen therefrom which will react with the organic portion of the gaseous organic source of titanium to form a gas or gases which may be removed by evacuation from the CVD chamber during the deposition. It should be noted, however, that the gaseous source of nitrogen should not include any materials which may liberate oxygen or in any way form oxide products or byproducts which could co-deposit with the titanium silicon nitride barrier layer and thereby increase the resistivity of the barrier layer.

The gaseous source of silicon must be capable of proving a source of silicon, and also should be capable of reacting with organic residues from decomposition of the gaseous titanium source, when the gaseous titanium source is an organic material. While the silicon source could be organic, preferably an inorganic source of silicon such as silane ($SiH_4$), or a substituted silane, e.g., $SiH_nX_{4-n}$, where X is a halogen and n is an integer from 0–3, is used as the gaseous source of silane. This is because of the liberation of hydrogen (and/or halogen) by evacuation from the CVD chamber during the deposition. It should also be noted, however, that like the gaseous source of nitrogen, the gaseous source of silicon should not include any materials which may liberate oxygen or in any way form oxide products or byproducts which could co-deposit with the titanium silicon nitride barrier layer and thereby increase the resistivity of the barrier layer. Other gaseous sources of silicon (in addition to silane or a substituted silane) which may be used in the formation of the titanium silicon nitride barrier layer of the invention include, for example, $Si_3H_9N$.

b. Proportions and Flow Rates of the Reactants

The reactant gases are flowed into a CVD chamber in which is already mounted on a susceptor the semiconductor substrate, including the insulation layer having the contact opening or via into which the barrier layer of the invention is to be deposited. The ratio of the flow rates of the gaseous silicon source to the gaseous nitrogen source will range from about 1 part by volume of the silicon source per 100 parts by volume of the nitrogen source (1:100 silicon to nitrogen) to about 2 parts by volume of the gaseous silicon source per part by volume of the gaseous nitrogen source (2:1 silicon to nitrogen). Preferably the ratio of the gaseous silicon source to the gaseous nitrogen source will range from about 1:10 to about 1:1 in parts by volume.

The minimum ratio of the gaseous titanium source to the other gaseous reactants will be at least about 1 part by volume of the gaseous titanium source per 20 parts by volume of the larger amount of either the gaseous silicon source or the gaseous nitrogen source (1:20). That is, the ratio of the gaseous source of titanium is measured against the gaseous nitrogen source, if the amount of the gaseous nitrogen source is larger than the amount of the gaseous silicon source, but is measured against the gaseous silicon source when the gaseous silicon source amount exceeds the amount of the gaseous nitrogen source used.

The maximum ratio of the gaseous titanium source to the larger of either the gaseous nitrogen source or the gaseous silicon source is about 1 part by volume of the gaseous titanium source per 1 part per volume of the larger amount of either the gaseous silicon source or the gaseous nitrogen source (1:1). Preferably the ratio of the gaseous titanium source to the larger of the gaseous silicon source or the gaseous nitrogen source will range from about 1:10 to about 1:2 in parts by volume.

The absolute amounts of the individual flow rates of the respective gaseous reactant sources, as well as the total gas flow, will depend upon the volume of the CVD chamber, with higher flow rates needed for larger chambers. For example, for a 35 liter CVD chamber, the flow rate of the respective gaseous reactants can be about 1,300 standard cubic centimeters per minute (sccm) of gaseous TDEAT, about 13,000 sccm of ammonia, and about 1,300 sccm of silane. If desired, a carrier gas may also be optionally added to the reactant gases to increase the total gas flow through the reactor.

c. The Reaction Temperature

The temperature of the semiconductor substrate during the deposition reaction should preferably be maintained between about 100° C. and about 500° C., and more preferably at a temperature between about 250° C. and about 400° C. Typically the temperature is maintained at about 350° C. Higher temperatures are preferred within these temperature ranges for purposes of obtaining lower resistivity, while lower temperatures within these temperature ranges are preferred from the standpoint of maintaining maximum step coverage of the deposited barrier layer.

d. Use of a Plasma

The use of a plasma during the CVD formation of the titanium silicon nitride barrier layer of the invention is optional, but may be particularly desirable when using lower deposition temperatures to improve the resistivity and to lower the thermal budget, for example, lower deposition temperatures ranging from about 100° C. to about 350° C. At higher deposition temperatures, a plasma may not be needed, but usually the use of a plasma will enhance the overall quality of the deposited film, regardless of the deposition temperature. The power level of such a plasma may range (expressed as an amount equivalent to the power used for a six inch diameter silicon wafer in a 35 liter deposition chamber) from about 100 watts to about 1000 watts.

e. The Reaction Pressure

The pressure in the CVD reactor may be maintained within a range of from about 100 milliTorr to about 100 Torr during the deposition. However, if the CVD deposition is carried out in the presence of a plasma, i.e., a plasma enhanced CVD (PECVD) deposition, the pressure is preferably maintained higher than 100 milliTorr, i.e., at least about 1 Torr, and typically about 30 Torr. When the gaseous source of titanium is an organic source, e.g., TDMAT or TDEAT, the pressure should be at least about 1 Torr, regardless of whether or not a plasma is used.

f. The Deposition Time and Thickness of the TiSiN/Barrier Layer

The time of the deposition reaction will depend upon the desired thickness of the deposited barrier layer. This, in turn, usually depends upon the desired amount or thickness of the TiSiN barrier layer needed to prevent diffusion of the aluminum and/or copper metal through the barrier layer, since this is the principal reason for use of the barrier layer in the via. As previously discussed, the thickness of the TiSiN barrier layer should not exceed about 150 Angstroms. Usually, the minimum amount of TiSiN barrier layer needed will be about half of the thickness needed in conventional TiN barrier layers to provide the same degree of diffusion protection. However, the minimum thickness of the TiSiN barrier layer should be at least about 40 Angstroms, and preferably at least about 75 Angstroms. If the diameter of the via or contact opening will permit it, the minimum thickness will be slightly higher. For example, for a 2000 Angstrom diameter via, the thickness of the barrier layer of the invention could typically be about 100 Angstroms to provide the desired barrier against diffusion of metals such as aluminum or copper through the barrier layer of the invention.

g. Example

To further illustrate the practice of the invention, two silicon substrates, each having the same integrated circuit structure formed thereon and each having an insulation layer formed thereon with a 3000 Angstrom diameter contact opening extending therethrough to an underlying silicon layer, can be processed as follows: One of the substrates was processed in accordance with the invention to form the TiSiN barrier layer of the invention, while the other substrate was processed in accordance with the prior art to form the prior art TiN barrier layer.

In accordance with the invention, the first substrate can be mounted in a 35 liter CVD chamber on a susceptor and heated to a temperature of about 350° C. Into the chamber will be flowed about 1,300 sccm of TDEAT, about 13,000 sccm of ammonia, and about 1,300 sccm of silane and a plasma will be ignited in the chamber at a power level of about 400 watts, while the pressure is maintained in the chamber at about 25 Torr. After 25 seconds, the flow of gases would be shut off and the plasma extinguished. A layer of CVD copper can then be conventionally deposited over the structure, to fill the barrier layer-coated contact. When the structure is then sectioned and examined under SEM, the barrier layer formed in accordance with the invention will be found to have a thickness of about 100 Angstroms and the respective silicon and CVD copper layers below and over the barrier layer will be found to not have diffused through the barrier layer of the invention. A resistivity measurement of the resulting TiSiN film will show a resistivity of as low as about 450 Ω/square, a satisfactory resistivity.

In contrast, a second substrate, representing the prior art, can be processed in the same 35 liter CVD chamber at the same temperature of about 350° C. and at the same pressure. Into the CVD chamber would be flowed about 1,300 sccm of TDEAT and about 13,000 sccm of ammonia (but without any silane). Again a plasma can be ignited in the chamber at a power level of about 400 watts. After 25 seconds, the flow of gases would be shut off and the plasma extinguished. A layer of CVD copper can then be conventionally deposited over the structure, to fill the barrier layer-coated contact. When the structure is then sectioned and examined under SEM, the TiN barrier layer formed in accordance with the prior art will be found to have a thickness of about 100 Angstroms and portions of the respective Si and CVD copper layers below and over the prior art TiN barrier layer will be found to have diffused through the prior art TiN barrier layer.

Thus, the invention provides an improved barrier layer for a via or contact opening formed in an insulating layer which will prevent diffusion of either underlying metal such as aluminum and/or copper, or filler metal in the via from diffusing through the barrier layer without the need for using an unduly thick barrier layer which would adversely impact the resistivity of the barrier layer, as well as create other problems associated with thick barrier layers.

Having thus described the invention what is claimed is:

1. A process for forming a singe barrier layer of titanium silicon nitride in a via or contact opening in an integrated circuit structure which comprises:
   a) providing an integrated circuit structure on a semiconductor substrate with an insulating layer thereon and one or more vias or contact openings formed through said insulating layer to an underlying conductive portion selected from the group consisting of a metal and said semiconductor substrate;
   b) mounting said semiconductor substrate in a CVD chamber;
   c) flowing into said chamber reactant gases comprising:
      i) a gaseous source of titanium;
      ii) a gaseous source of silicon; and
      iii) a gaseous source of nitrogen;
   whereby a barrier layer of TiSiN is formed on sidewall surfaces of said via or contact opening and over said underlying conductive portion to separate said conductive portion from filler material subsequently placed in said one or more vias or contact openings.

2. The process of claim 1 wherein said gaseous source of titanium comprises a gaseous organic source of titanium.

3. The process of claim 2 wherein said gaseous source of silicon comprises a material capable of reacting with the organic portion of said gaseous organic source of titanium to form a gaseous byproduct whereby deposit of carbonaceous materials in said chamber will be inhibited.

4. The process of claim 2 wherein said gaseous source of silicon has the formula $SiH_nX_{n-4}$, wherein n is an integer from 0 to 4, and X is a halogen.

5. The process of claim 2 wherein said gaseous source of nitrogen comprises a material capable of reacting with the organic portion of said gaseous organic source of titanium to form a gaseous byproduct whereby deposit of carbonaceous materials in said chamber will be inhibited.

6. The process of claim 2 wherein said gaseous source of nitrogen comprises ammonia.

7. The process of claim 1 wherein the ratio of said gaseous source of silicon to said gaseous source of nitrogen flowing into said CVD chamber ranges from about 1:100 to about 2:1, in parts by volume.

8. The process of claim 1 wherein the ratio of said gaseous source of titanium to the larger of either said gaseous source of silicon or said gaseous source of nitrogen flowing into said CVD chamber ranges from about 1:20 to about 1:1, in parts by volume.

9. The process of claim 1 wherein said deposition is carried out while maintaining said silicon substrate in said CVD chamber at a temperature ranging from about 100° C. to about 500° C.

10. The process of claim 1 wherein said deposition is carried out while maintaining said CVD chamber at a pressure of from about 100 milliTorr to about 100 Torr.

11. The process of claim 1 wherein said deposition is carried out in said CVD chamber while a plasma is maintained in said chamber at a power level equivalent to a power level of from about 100 watts to about 1000 watts for a six inch diameter wafer in a 35 liter chamber.

12. A process for forming a barrier layer for use in a via or contact opening in an integrated circuit structure which comprises:
  a) providing an integrated circuit structure on a semiconductor substrate with an insulating layer thereon and one or more vias or contact openings formed in said insulating layer;
  b) maintaining said semiconductor substrate at a temperature of from about 100° C. to about 500° C. in a CVD chamber maintained at a pressure ranging from about 100 milliTorr to about 100 Torr;
  c) flowing into said chamber reactant gases comprising:
    i) a gaseous organic source of titanium;
    ii) a gaseous source of silicon capable of reacting with the organic portion of said gaseous organic source of titanium to form a gaseous byproduct; and
    iii) a gaseous source of nitrogen capable of reacting with the organic portion of said gaseous organic source of titanium to form a gaseous byproduct; and
  d) optionally igniting a plasma in said chamber at a power level equivalent to a power level of from about 100 watts to about 1000 watts in a 35 liter chamber;
  whereby a barrier layer of TiSiN is formed on the surfaces of said via or contact opening.

13. The process of claim 12 wherein said gaseous source of silicon has the formula $SiH_nX_{n-4}$, wherein n is an integer from 0 to 4, and X is a halogen.

14. The process of claim 12 wherein said gaseous source of nitrogen comprises ammonia.

15. The process of claim 12 wherein the ratio of said source of silicon to said source of nitrogen flowing into said CVD chamber ranges from about 1:100 to about 2:1, in parts by volume.

16. The process of claim 12 wherein the ratio of said gaseous source of titanium to the larger of either said gaseous source of silicon or said gaseous source of nitrogen flowing into said CVD chamber ranges from about 1:20 to about 1:1, in parts by volume.

17. The process of claim 12 wherein said organic source of titanium is selected from the group consisting of TDMAT and TDEAT.

18. A process for forming a barrier layer for use in a via or contact opening in an integrated circuit structure which comprises:
  a) providing an integrated circuit structure on a semiconductor substrate with an insulating layer thereon and one or more vias or contact openings formed in said insulating layer;
  b) maintaining said semiconductor substrate at a temperature of from about 100° C. to about 500° C. in a CVD chamber maintained at a pressure ranging from about 100 milliTorr to about 100 Torr;
  c) flowing into said chamber reactant gases comprising:
    i) a gaseous organic source of titanium;
    ii) a gaseous source of silicon capable of reacting with the organic portion of said gaseous organic source of titanium to form a gaseous byproduct, said gaseous source of silicon having the formula $SiH_nX_{n-4}$, wherein n is an integer from 0 to 4, and X is a halogen; and
    iii) a gaseous source of nitrogen comprising ammonia to react with the organic portion of said gaseous organic source of titanium to form a gaseous byproduct; and
  d) optionally igniting a plasma in said chamber at a power level equivalent to a power level of from about 100 watts to about 1000 watts for a six inch diameter wafer in a 35 liter chamber;
  whereby a barrier layer of TiSiN is formed on the surfaces of said via or contact opening.

19. The process of claim 18 wherein the ratio of said source of silicon to said source of nitrogen flowing into said CVD chamber ranges from about 1:5 to about 2:1, in parts by volume.

20. The process of claim 18 wherein the ratio of said gaseous source of titanium to the larger of either said gaseous source of silicon or said gaseous source of nitrogen flowing into said CVD chamber ranges from about 1:10 to about 1:2, in parts by volume.

21. A process for forming a single barrier layer of titanium silicon nitride having a resistivity level not exceeding 1000 Ω/square for use in a via or contact opening in an integrated circuit structure to separate conductive filler material in said via or contact opening from underlying conductive material which comprises:
  a) providing an integrated circuit structure on a semiconductor substrate with an insulating layer thereon and one or more vias or contact openings formed in said insulating layer over an underlying conductive material selected from the group consisting of silicon and a metal;
  b) mounting said semiconductor substrate in a CVD chamber;
  c) forming a single barrier layer of titanium silicon nitride directly on the sidewall surfaces of said via or contact opening and directly over exposed portions of said underlying conductive material beneath said via or contact opening by flowing into said chamber reactant gases comprising:
    i) a gaseous source of titanium;
    ii) a gaseous source of silicon; and iii) a gaseous source of nitrogen;

whereby a single barrier layer of titanium silicon nitride is formed directly on said sidewall surfaces of said via or contact opening and directly over said underlying conductive material beneath said barrier layer to separate said underlying conductive material from conductive filler material subsequently used to fill said via or contact opening.

* * * * *